United States Patent [19]
Fleisher

[11] Patent Number: 6,016,563
[45] Date of Patent: Jan. 18, 2000

[54] METHOD AND APPARATUS FOR TESTING A LOGIC DESIGN OF A PROGRAMMABLE LOGIC DEVICE

[76] Inventor: Evgeny G. Fleisher, 1149 Danbury Dr., San Jose, Calif. 95129

[21] Appl. No.: 09/001,109

[22] Filed: Dec. 30, 1997

[51] Int. Cl.[7] .............................. G01R 31/28; G06F 11/00
[52] U.S. Cl. ............................ 714/725; 714/724; 714/28; 714/40; 395/500.44; 324/754
[58] Field of Search .................................. 714/28, 27, 40, 714/724, 725; 395/500.44; 712/227; 324/754, 755

[56] References Cited

U.S. PATENT DOCUMENTS

| | | |
|---|---|---|
| 4,306,286 | 12/1981 | Cocke et al. . |
| 4,527,115 | 7/1985 | Mehrotra et al. . |
| 4,539,564 | 9/1985 | Smithson . |
| 4,590,581 | 5/1986 | Widdoes, Jr. . |
| 4,635,218 | 1/1987 | Widdoes, Jr. . |
| 4,901,259 | 2/1990 | Watkins . |
| 5,369,593 | 11/1994 | Papamarcos et al. . |
| 5,392,420 | 2/1995 | Balmer et al. . |
| 5,448,717 | 9/1995 | Balmer et al. . |
| 5,477,475 | 12/1995 | Sample et al. . |
| 5,537,341 | 7/1996 | Rose et al. . |
| 5,574,892 | 11/1996 | Christensen . |
| 5,625,580 | 4/1997 | Read et al. . |
| 5,644,515 | 7/1997 | Sample et al. . |
| 5,657,442 | 8/1997 | Groves . |
| 5,661,662 | 8/1997 | Butts et al. . |

*Primary Examiner*—Robert W. Beausoliel, Jr.
*Assistant Examiner*—Brian H. Shaw
*Attorney, Agent, or Firm*—Blakely, Sokoloff, Taylor & Zafman LLP

[57] ABSTRACT

An apparatus and method are provided for the development, testing and verification of a logic design of a programmable logic device in a real-time user environment to simplify the development of the programmable logic device and associated systems. The apparatus comprises an emulation programmable logic device based on the same family and package of the target programmable logic device. The adapter further comprises a plurality of individually programmable switches for selectively coupling the emulation device to the target device or to a logic device substituting for the target device. The apparatus further comprises a controller, which configures the switches based on control signals received from a host computer system, such that a stimulus applied to the input pins of the target or substitute device are also applied concurrently to the corresponding input pins of the emulation device. The switches are further configured so that the output pins of the emulation device are unloaded from all of their normal functions and are output only as test points. Signal values at internal nodes of the emulation device in response to the stimulus can be traced out via the test points without disturbing the target or substitute device. The apparatus permits dynamic and independent programming and reprogramming of both the target and mirror devices, such that different internal nodes can be traced out quickly and easily. The apparatus may further include an embedded programmable stimulus generator and an embedded logic analyzer.

35 Claims, 7 Drawing Sheets

METHOD AND APPARATUS FOR TESTING A LOGIC DESIGN OF A PROGRAMMABLE LOGIC DEVICE

FIELD OF THE INVENTION

The present invention pertains to programmable logic devices and, more particularly, to verification and testing of the logic designs associated with programmable logic devices.

BACKGROUND OF THE INVENTION

A problem which is associated with the development of programmable logic devices is how to test and verify the internal logic of such devices. One technique which has been commonly used for this purpose is software simulation. Software simulation, however, has several disadvantages. In particular, software simulation tends to be computationally intensive, and therefore, very slow. In addition, a substantial amount of time and expense may be required to develop and then analyze an appropriate software simulation model. In addition, because the software stimulus is prepared by humans, software simulation techniques tend to be susceptible to errors.

Hardware based approaches also have disadvantages. For example, many hardware based approaches have been very complex and difficult to use. Certain hardware simulation systems have proven susceptible to latent flaws in the electronics for stimulating the target device and analyzing its outputs; such flaws have been known to cause a target device to be inadvertently stimulated while analyzing the outputs, resulting in erroneous simulation results. Other testing approaches, such as JTAG, have included designing extra circuitry into a logic device specifically for testing purposes. In the design of integrated circuits, however, in which the amount of available chip area and the number of available pins may be limited, it is not desirable to consume chip area and pins for testing purposes. In addition, JTAG and other similar techniques do not allow the real-time trace out of multiple internal nodes of a logic device and do not provide continuous-in-time information about the state of a node. Rather, information about a node can only be traced out based on the rate of the clock used to latch the internal node to the JTAG register.

Hence, it is desirable to have an efficient, reliable, and inexpensive technique by which a programmable logic device can be tested in a short period of time and in a manner that is not disruptive to the target device. It is further desirable to have such a technique which does not require extra circuitry or extra pins on the device to be tested. It is further desirable that such a technique allow real-time, continuous trace out of multiple internal nodes of a programmable logic device and allow quick tests and comparisons of different logic designs, which may be based on different design assumptions.

SUMMARY OF THE INVENTION

The present invention includes an apparatus for enabling testing of a logic device. The apparatus includes a first logic device and a plurality of configurable connections coupled to the first logic device to enable configurable coupling of the first logic device to a second logic device. In particular embodiments of the present invention, the first and second logic devices may be programmable logic devices; the first logic device may be substantially identical to a target logic device for purposes of emulating the target device; the second logic device may be the target device itself or another logic device which substitutes for the target device; and, the configurable connections enable trace-out of internal nodes of the first logic device in response to input applied to both the first and second logic devices, without disturbing the target logic device. Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

An apparatus and method for the development, testing and verification of programmable logic devices are described. In the following description, for purposes of explanation, numerous specific details are set forth in order to provide a thorough understanding of the present invention. It will be evident, however, to one skilled in the art that the present invention may be practiced without these specific details. In other instances, well-known structures and devices are shown in block diagram or other symbolic form in order to facilitate description of the present invention.

The present invention includes an emulation system which facilitates the development, verification, and testing, in a real-time user target environment, of complex programmable logic devices, such as electrically programmable logic devices (EPLDs), field-programmable gate arrays (FPGAs), programmable array logic (PAL) devices, application-specific integrated circuits (ASICs), etc. In particular, the system provides the capability to trace out internal nodes of the logic design of a target programmable logic device in response to real or simulated input signal patterns, without degradation in timing on the user board and without disturbing operation of the target device. In contrast with other hardware based techniques, the present invention requires no additional chip area for simulation or emulation purposes.

Figure 1:
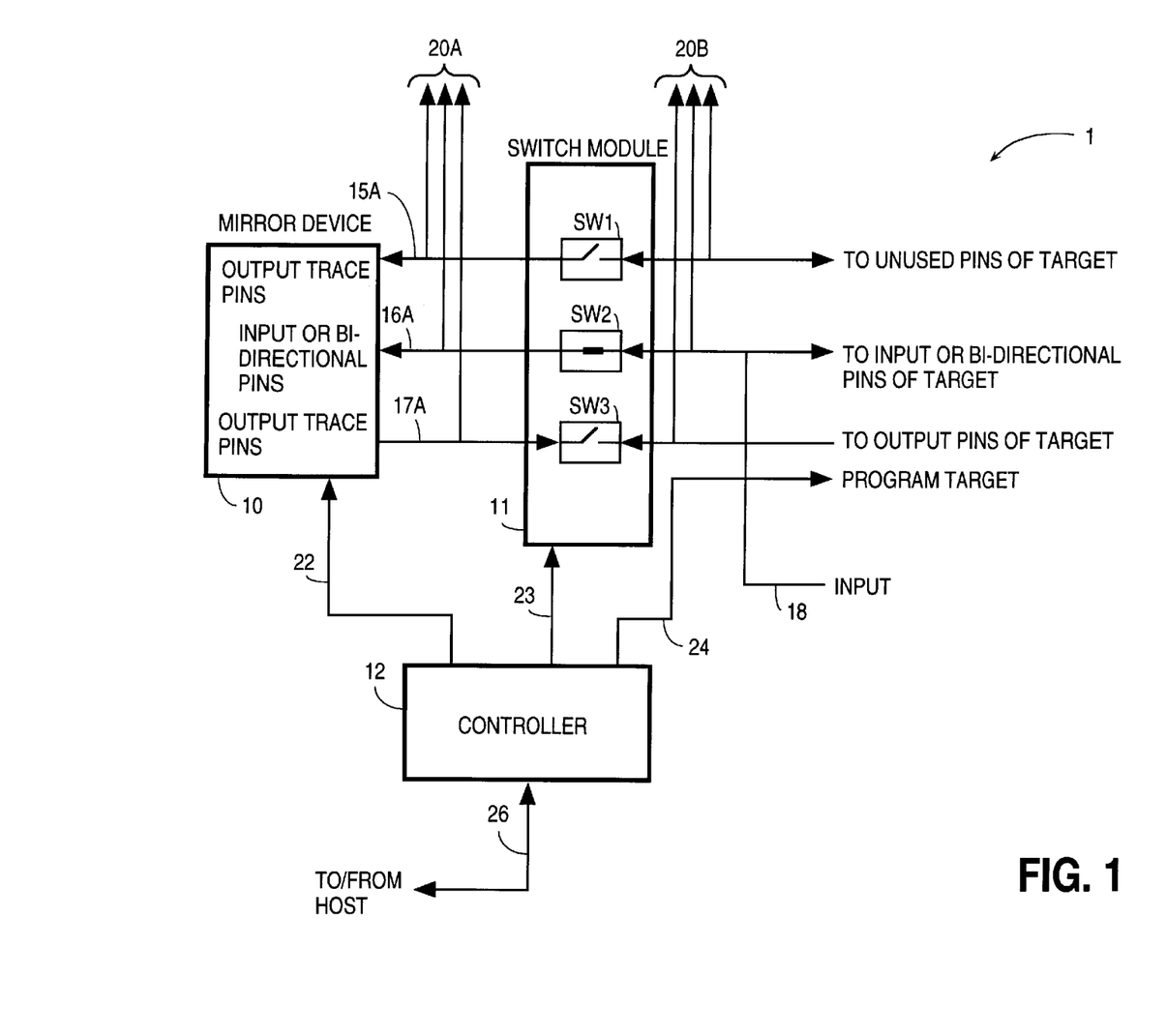
FIG. 1 is a block diagram illustrating an emulation system for testing a programmable logic device in accordance with the present invention.

Generally, an emulation system of the present invention includes a symmetrical pair of programmable logic devices, i.e., the target programmable logic device and a programmable logic device that is essentially identical to the target device and is referred to herein as the "mirror" device or the "emulation" device. The mirror device is from the same device family and has the same package as the target device and operates as an exact replica of the target device in the user-defined target environment. Referring now to FIG. 1, an emulation system 1 of the present invention is shown, according to one embodiment. The system 1 allows internal nodes of the logic design of the target device (not shown) to be traced out in response to input signals 18 using output pins 17A of the mirror device 10, which have been unloaded from their normal functions. The system 1 also includes a switching module 11 containing a number of individually programmable "zero ohm" switches SW1, SW2 and SW3, connected between the input/output (I/O) pins of the target device and the mirror device 10. The system further includes a controller 12 coupled to the switching module 11. The configuration (open/closed states) of the switches of module 11 is determined by the controller 12 based on control input received from a host computer.

When operating in a normal, "under test" mode, the system 1 enables a user to trace out virtually any number of internal nodes of the original logic design. In the "under test" mode, the target device is loaded with a user design image (logic design), and the mirror device 10 is loaded with the same design image. The output pins 17A of the mirror device 10 are unloaded from their original functions and used to trace out user-defined internal nodes of the original design from the mirror device 10. To this end, the output pins 17A of the mirror device 10 are connected only to test points 20A, which can be connected to a logic analyzer. The I/O pins of the target device can also be output for connection to the logic analyzer at test points 20B. Hence, the programmable switches SW1, SW2, SW3 are configured so that all input pins on both the target device and the mirror device have connections to the appropriate points on the target board (i.e., the user application board), but so that the output pins 17B of only the target device are connected to the target board. The switches of switching module 11 have relatively low capacitance (e.g., about 5 pF) and therefore introduce negligible delays. Switching module 11 may be any of a number of commercially available programmable switching modules which are suitable for this purpose, such as the QS3125 switch from Quality Semiconductor, Inc. of Santa Clara, Calif. Thus, the "under test" configuration of the system enables a user to trace out various internal nodes of the original logic design through the unloaded output pins 17A of the mirror device 10, without disturbing the target device It should be noted at this point that the term "pin" is used generically in this description to refer to any external connection to an integrated circuit package; thus, "pin" may also refer to, for example, a ball contact of a ball grid array (BGA). In addition, note that the switching module 11 is illustrated and described as including three programmable switches SW1, SW2, SW3 in order to simplify description; however, each of switches SW1, SW2 and SW3 actually represents one or more switches associated with a given category of I/O pin (i.e., input, output, or unused). In practice, there will generally be one physical switch for each I/O pin on the target device. Accordingly, the actual number of switches employed in switching module 11 depends upon the type or types of devices to be emulated by the system 1, and more specifically, on the number of I/O terminals associated with such devices.

Figure 2:
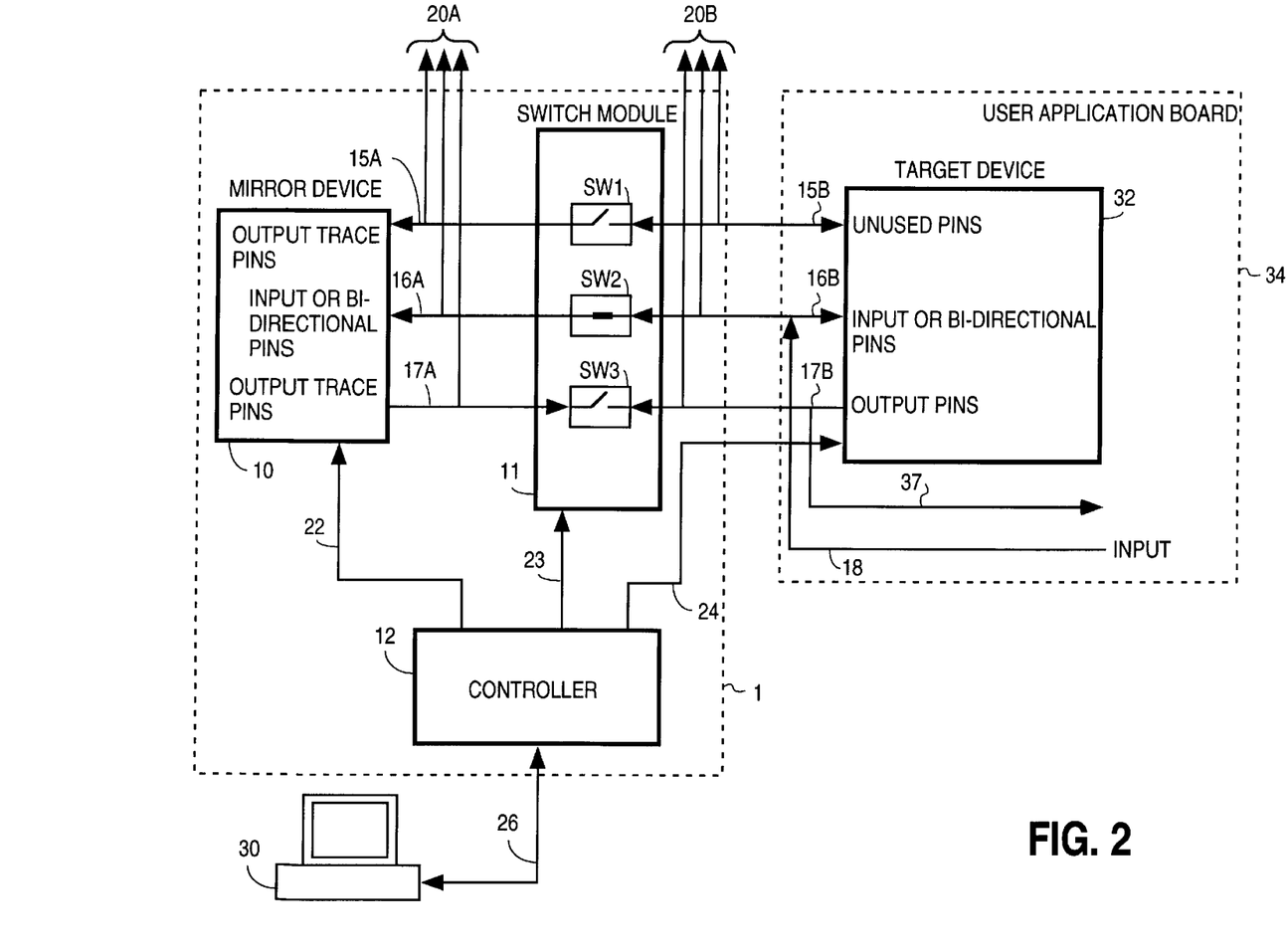
FIG. 2 illustrates an emulation system connected to a target device.

FIG. 2 illustrates a manner in which the adapter system 1 may be connected to a target device 32 on a target board 34 and configured in the "under test" mode. As shown, the input and bi-directional pins 16B of the target device 32 are connected to receive a stimulus input signal 18, which may originate from elsewhere on the target board 34. Output pins 17B of the target device are connected via signals 37 to appropriate locations on the target board 34 that make use of those outputs.

The controller 12 appropriately configures the switches of switching module 11 based on control inputs received from the host computer 30, as will be discussed below. The control inputs are generated by application software executing on the host computer 30, which interacts with the emulation system 1 via communication channel 26. The communication channel 26 can allow multiple emulation systems such as system 1 to be connected to a single host computer 30. The communication channel 26 can be implemented using a small number of the signals from parallel printer ports of the host computer 30. Alternatively, other types of communication channels can be used, such as serial RS-232 type, Universal Serial Bus (USB), or 10/100BaseT Ethernet.

The controller 12 is coupled to the mirror device 10 via channel 22, to the switching module 11 via channel 23, and to the target device 32 via channel 24. Channels 22 and 24 are used by the controller 12 for programming the logic designs of mirror device 10 and the target device 32, respectively. Channel 23 is used by controller 12 to configure the programmable switches of switch module 11. The controller 12 includes a command register, which configures the communication channel 26 to communicate with the appropriate destination, such as the target device 32, the mirror programmable device 10, serial EEPROMs on the target and mirror devices, or internal control registers on the adapter system 1.

In the "under test" mode, switches SW2 of the switching module 11 are configured by the controller 12 to be closed, such that each of the input and bi-directional pins 16B of the target device 32 is coupled via one of switches SW2 to the matching pin 16A of the mirror device 10. Note that any bi-directional pins 16A of the mirror device 10 are changed to input pins, which can be done automatically by application software running on the host computer 30. Switches SW3 are configured by the controller 12 to be open, such that output pins 17A of the mirror device are decoupled from the corresponding output pins 17B of the target device 32. The output pins 17A of the mirror device are unloaded from all of their standard functions of the target design and are instead used to trace out internal nodes of the mirror device 10 at test points 20A in response to input stimulus. Switches SW1 are also programmed by the controller 12 to be open, such that unused pins 15B of the target device 32 are decoupled from the corresponding pins 15A on the mirror device 10. Hence, pins 15A of the mirror device 10, which correspond to the unused pins 15B of the target device 32, may also be used to trace out internal nodes of the mirror device at test points 20A. Thus, all pins of the mirror device 10 are provided as external connections of the adapter system 1 at test points 20A, as are all pins of the target device 32 at test points 20B.

The application software on the host computer 30 maintains project associated design and file structures and performs automated functions for downloading design files to the mirror device 10 and the target device 32. The application software thereby enables dynamic and independent reconfiguration of the target device 32 and the mirror device 10. Thus, the logic design of the mirror device 10 can be easily and repeatedly reprogrammed to trace out various different internal nodes of the target device 10 in a short period of time. The application software also checks the consistency between the design files used and the type of the adapter (i.e., type of mirror device).

Figure 3:
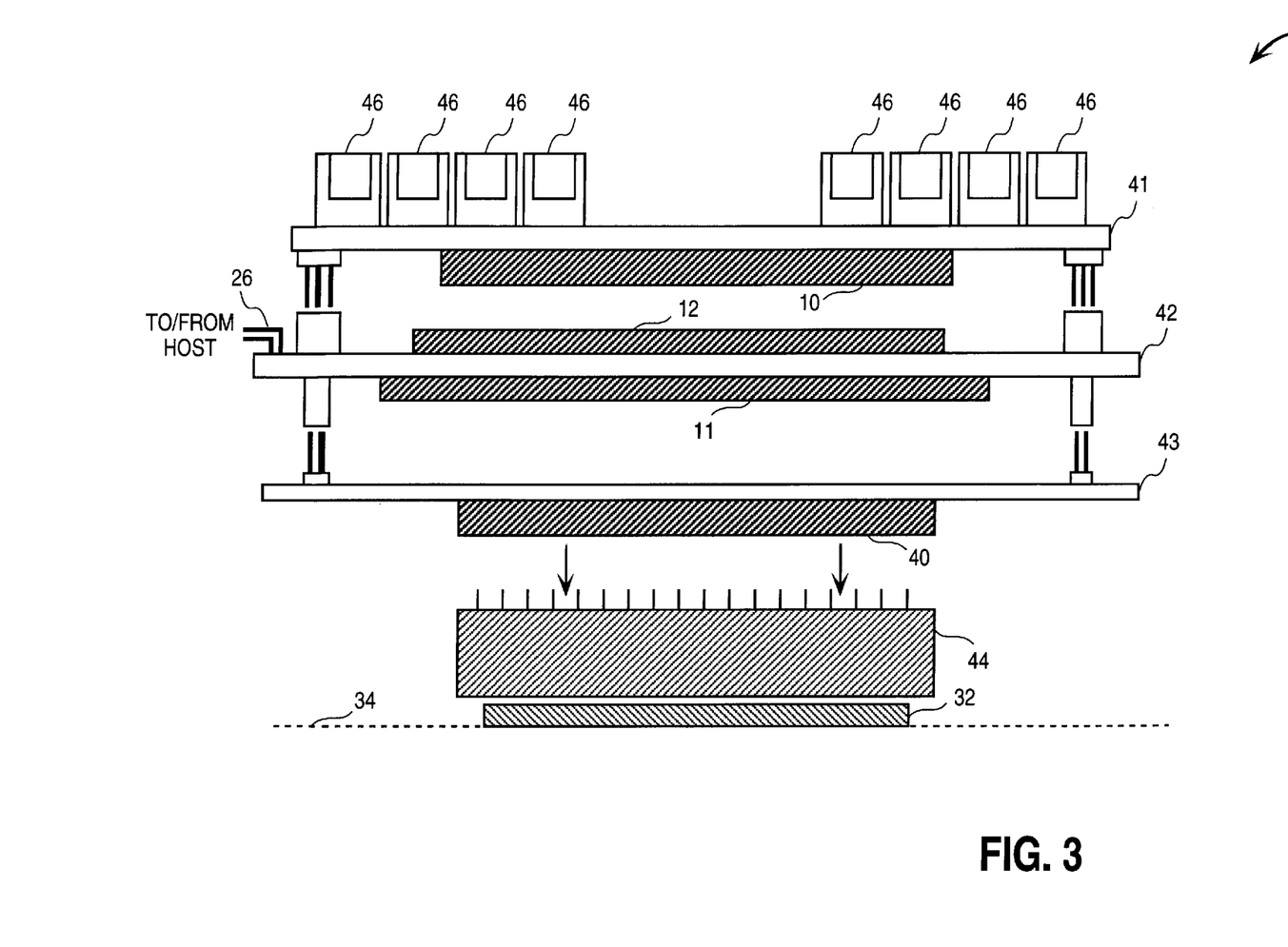
FIG. 3 illustrates an embodiment of the emulation system which has three circuit boards and a clip-on adapter for connecting to the emulation system to a target device.

An emulation adapter system of the present invention can be physically embodied in various different ways. For example, in certain embodiments, the emulation system can be in the form of a stand-alone unit that can be connected to the target board through a flexible, impedance-controlled cable. In other embodiments, the system 1 can be mounted on top of the target device using a clip-on adapter, such as are well known in the art, or another similar type of connector. FIG. 3 illustrates an embodiment which employs a clip-on adapter to connect to the target device 32. In the embodiment of FIG. 3, the emulation system 1 includes three separate component boards. The mirror device 10 and a number of test connectors 46 are mounted to a top board 41, which is universal for a given device family and package. The test connectors include contacts for test points 20A and 20B. The programmable switches 11 and the controller 12 are mounted to a middle board 42, which is mounted to the top board 41, and which is universal per adapter, with a staffing option for the number of the I/O pin switches and control registers. The communication channel 26 with the host computer 30 also connects to the middle board 42. A bottom board 43 is mounted to the middle board 42. Mounted to the bottom board 43 is an adapter socket 40, which mates to the clip-on connector 44. The opposite end of the clip-on connector 44 clips onto the target device 32 on the target board 34 to make contact with the I/O pins of the target device 32.

The adapter socket 40 may be any of a number of conventional pin grid array (PGA) devices, such as the SK-MGA 17/208A-01 mini grid PGA socket from Ironwood Electronics of St. Paul, Minn. The clip-on connector 44 may be a conventional Plastic Leadless Chip Carrier (PLCC) or Plastic Quad Flat Pack (PQFP). Examples of parts that may be suitable as the clip-on connector 44 include the LC-PLCC 84-01 from Ironwood Electronics, the RoboClip base or the PolyPod base from Emulation Solutions of Sunnyvale, Calif., and the EPC-240-QF62C-SM from Emulation Technology, Inc. of Santa Clara, Calif.

In other embodiments, the emulation adapter system 1 may include a second programmable logic device, in addition to the mirror device 10, that is identical to the target device and operates as a replacement (substitute) for the target device. In such an embodiment, the adapter system 1 is in the form of a replacement pod that connects directly to the target board in place of the target device. This embodiment will now be described in greater detail with reference to FIG. 4.

Figure 4:
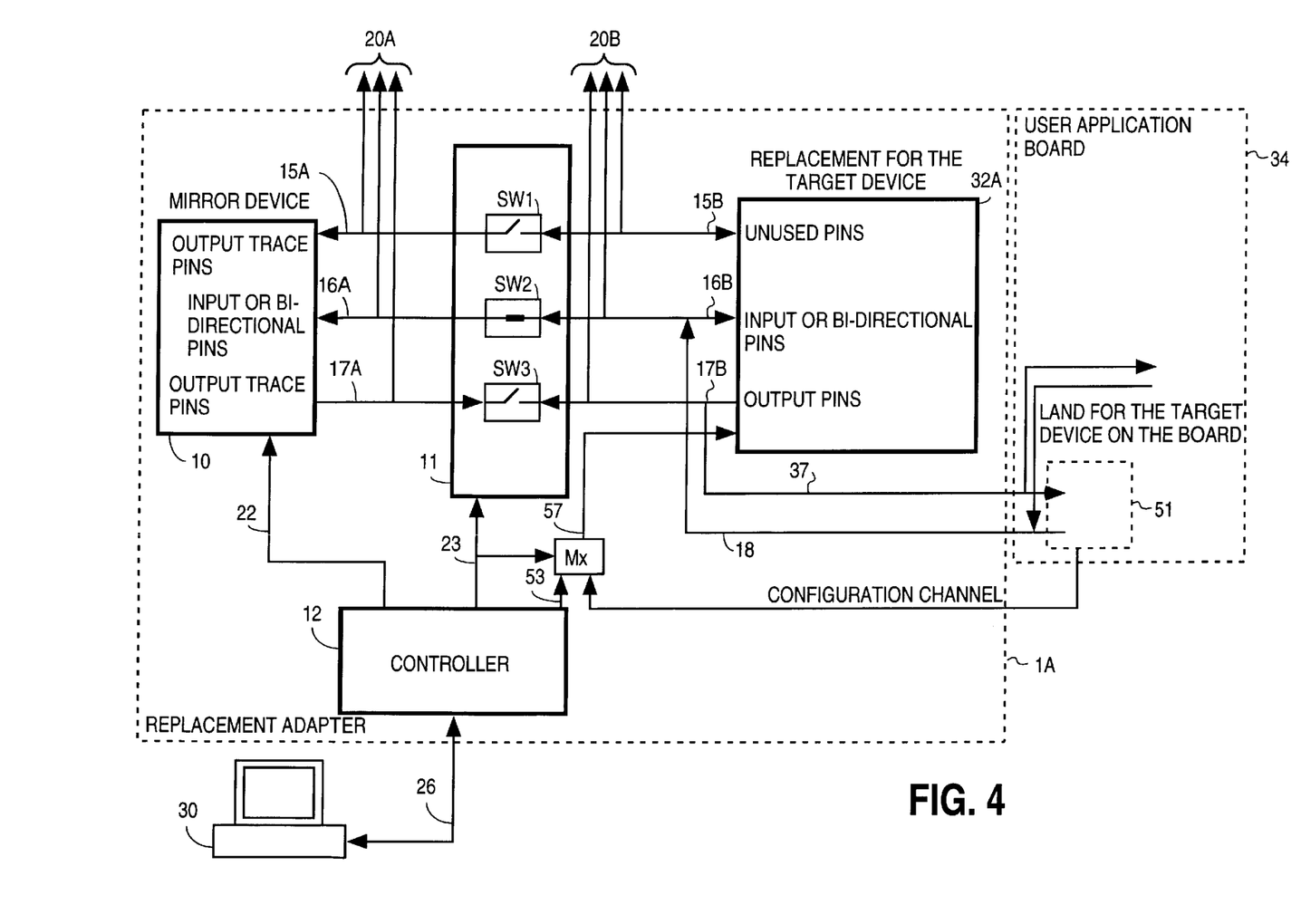
FIG. 4 illustrates an embodiment of an emulation system which includes a replacement programmable logic device substituting for the target device.

FIG. 4 shows an emulation adapter system 1A of the present invention, which includes a replacement logic device 32A. Except as noted below, the connections are essentially the same as those described in conjunction with FIG. 2. The absence of the target device on the target board 34 is indicated by box 51, which represents the area of the target board 34 which would be occupied by the target device. Outputs 37 of the replacement device are provided to the appropriate locations on the target board 34, as if they were generated by the target device.

The channel for downloading the Target device can be configured using a programmable switch Mx for downloading from either the host computer 30 (via the emulation system 1A) or from the target board 34. The switch Mx may be one of the switches included in the switching module 11, although it is shown separately in FIG. 4. Hence, in the embodiment of FIG. 4, the switch Mx is configured by the controller 12 using channel 23 to select as input either configuration channel 53 from the controller 12 or configuration channel 58 from the target board 34 for purposes of programming the replacement device 32A.

Figure 5:
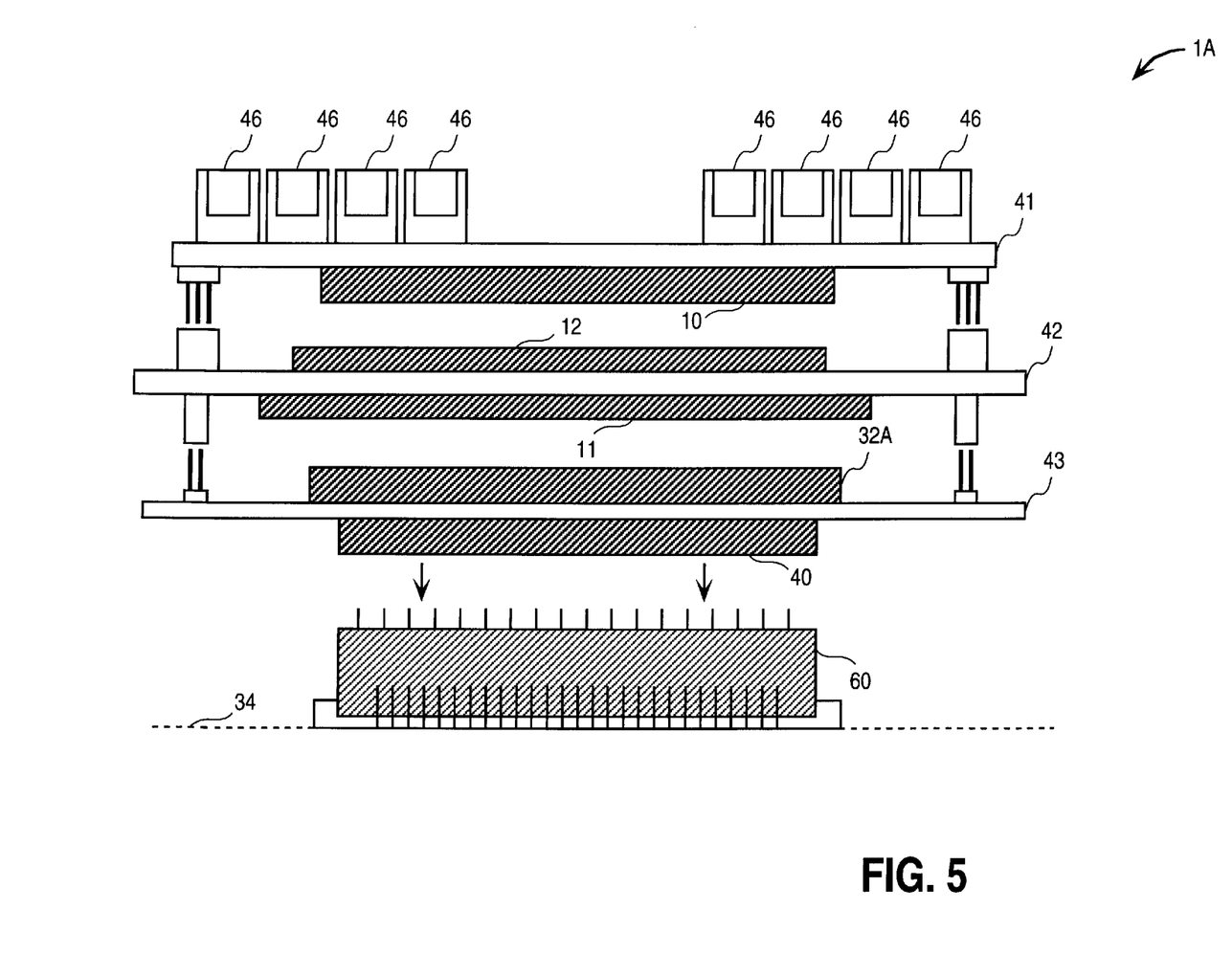
FIG. 5 illustrates an embodiment of the emulation system of FIG. 4 which has three circuit boards.

FIG. 5 illustrates one example of how an embodiment according to FIG. 4 may be constructed. As can be seen, the embodiment of FIG. 5 is substantially similar to that of FIG. 3. However, the replacement device 32A is also mounted to the bottom board 43 in addition to the adapter socket 40. Also, a surface-mounted replacement land part 60, which mates to adapter socket 40, is mounted to area 51 on the target board 34 in place of the target device, to allow connection of the emulation system 1A to the target board 34. The replacement land part 60 may be a conventional BGA or PQFP device, such as the SF-QFE208SB-G-01 from Ironwood Electronics or the EPP-208-QF07-SM from Emulation Technology.

Numerous variations on and modifications to the above described embodiments are possible within the scope of the present invention. For example, since the number of output pins of a programmable logic device can vary from design to design, additional mirror devices can be included in the emulation system to provide a sufficient number of output pins, which may be used for trace-out functions.

Figure 6:
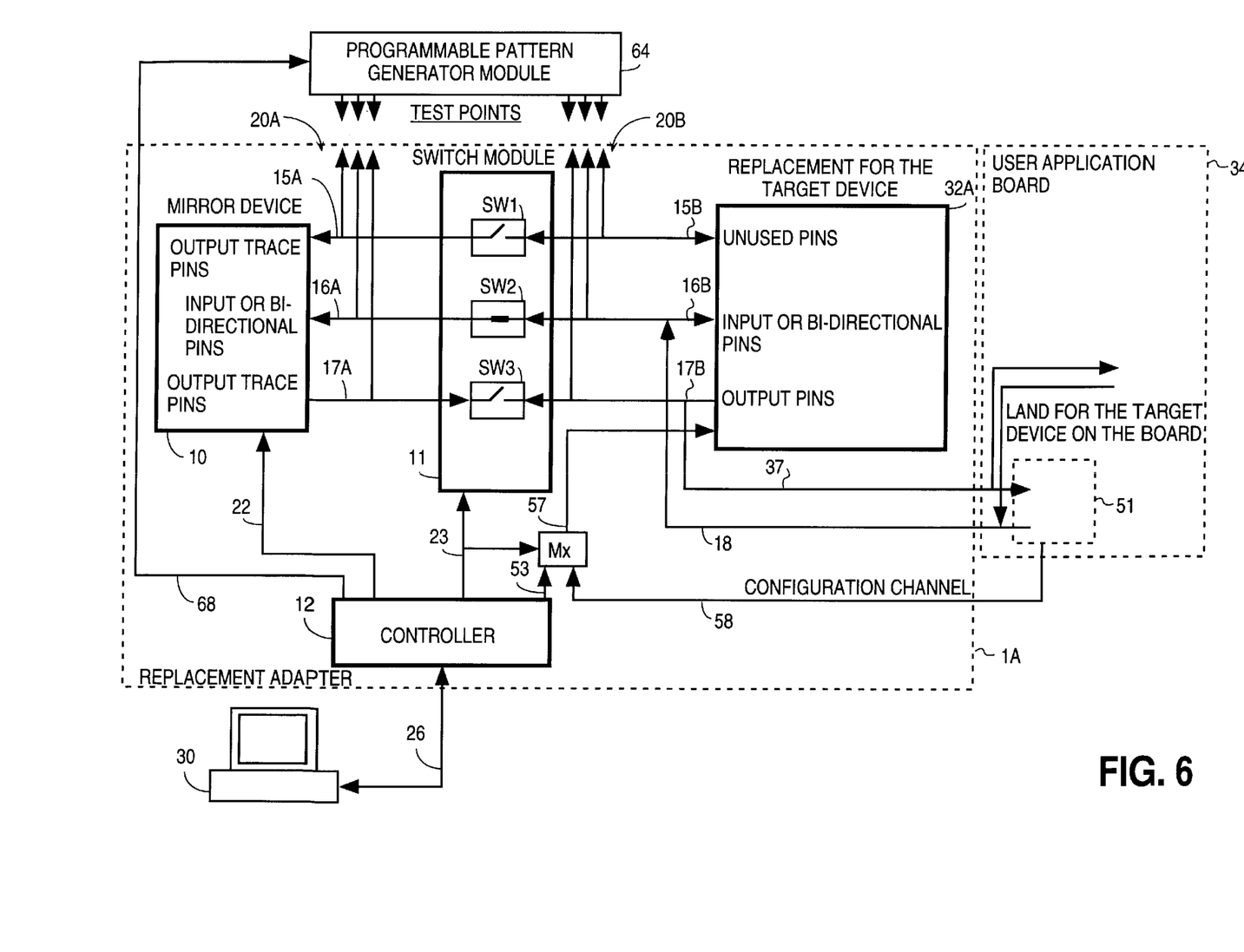
FIG. 6 illustrates an embodiment of an emulation system which includes a programmable pattern generator.

Further, an emulation adapter system of the present invention may also include an embedded programmable pattern generator for providing the real-time input stimulus. Such an embodiment can be used to emulate the target device in real-time without a target board (i.e., emulation on the bench) or to provide an additional stimulus when emulation with the target board is completed. FIG. 6 illustrates an embodiment similar to that of FIG. 4 but which also includes a programmable pattern generator 64. The pattern generator 64 connects to test points 20A and 20B and is controlled by the controller 12 using signal 68. The stimulus can be generated by the application software on the host computer 30 or can be imported from industry-standard simulators or from a previously created logic analyzer database file.

In various embodiments, the mirror device 10, the replacement device 32A, or both, may be removably attachable to their respective circuit boards to facilitate quick and easy replacement or substitution of those parts. As a result, a single emulation system according to such an embodiment can be easily reconfigured manually to allow the testing of various different programmable devices. Further, an emulation system of the present invention provides for the connection of test equipment, such as a logic analyzer, to multi-pin packages, such as BGAs, PQFPs, PGAs, and PLCCs.

The application software on the host computer 30 can automatically configure the logic analyzer and simplify pretest procedures. For example, the software may automatically provide the appropriate signal names from the target device's design file to the logic analyzer. Such functionality reduces the possibility of errors and reduces the amount of time spent on test preparation. The emulation system may provide separate connection points to the logic analyzer for this purpose, such that configuration of the logic analyzer may be performed by the emulation system under control of the host computer.

Figure 7:
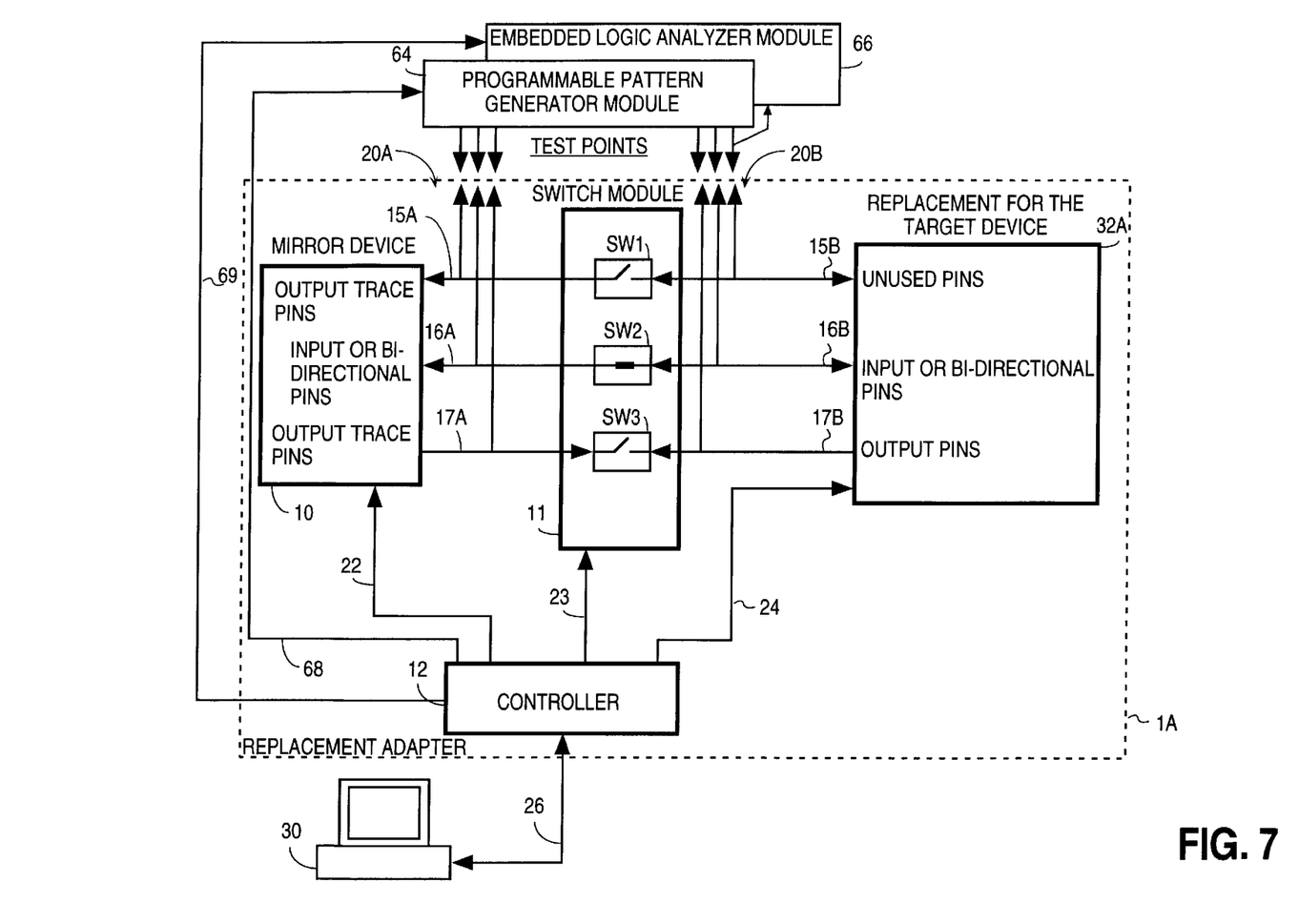
FIG. 7 illustrates an embodiment of an emulation system which includes an embedded logic analyzer module.

An emulation system of the present invention may also include an embedded logic analyzer. As an example, FIG. 7 shows an embodiment similar to that of FIG. 6 but also including an embedded logic analyzer module 66. The embedded logic analyzer module 66 connects to test points 20A and 20B in parallel with the programmable pattern generator 64. The controller 12 appropriately configures the logic analyzer 66 using signal 69, based on signals received from the host computer 30.

As noted above, the technique of the present invention can be implemented for many standard programmable devices, such as SRAM based FPGAs, in-circuit EPLDs, and one-time programmable devices and ASICs. Certain ASICs, for example, can be tested using additionally manufactured bond out chips that use unloaded output pins to trace out predetermined internal nodes.

Thus, an apparatus and method for the development, testing and verification of programmable logic devices have been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative sense rather than a restrictive sense.

What is claimed is:

1. An apparatus for enabling testing of a logic device, the apparatus comprising:
   a first logic device having a plurality of input terminals and a plurality of output terminals;
   a plurality of configurable connections coupled to the first logic device to enable configurable coupling of the first logic device to a second logic device, the second logic device having a plurality of input terminals and a plurality of output terminals corresponding to the input terminals and the output terminals of the first logic device; and
   a controller configured to control the plurality of switchable connections to couple the input terminals of the first logic device to corresponding input terminals of the second logic device and to decouple the output terminals of the first logic device from corresponding output terminals of the second logic device.

2. An apparatus according to claim 1, wherein the first and second logic devices are programmable logic devices.

3. An apparatus according to claim 2, wherein the first programmable logic device has a device type and a package type that are substantially identical to a device type and a package type of the second programmable logic device.

4. An apparatus according to claim 3, wherein the plurality of configurable connections are programmable to selectively couple particular input or output terminals of the first programmable logic device with corresponding input or output terminals of the second programmable logic device.

5. An apparatus according to claim 1, wherein the controller dynamically reconfigures the configurable connections in responsive to input received from a host processing system.

6. An apparatus for testing a logic design of a target programmable logic device, the apparatus comprising:
   a mirror programmable logic device substantially identical to the target programmable logic device, the mirror programmable logic device and the target programmable logic device each having a plurality of input terminals and a plurality of output terminals;
   a plurality of switches, each of the switches for connection between a terminal of the mirror programmable logic device and a corresponding terminal of the target programmable logic device; and
   a controller for selectively configuring the switches to allow analysis, without affecting any of the output terminals of the target programmable logic device, of an output of the mirror programmable logic device in response to a stimulus applied to the mirror programmable logic device via one of the switches and to the target programmable logic device.

7. An apparatus according to claim 6, wherein the controller is for configuring the switches based on first control inputs received from a host processing system.

8. An apparatus according to claim 6, wherein the controller is further coupled to the mirror programmable logic device for programming the mirror programmable logic device with selected logic designs.

9. An apparatus according to claim 8, wherein the controller is further coupled to the target programmable logic device for programming the target programmable logic device with selected logic designs.

10. An apparatus according to claim 9, wherein the controller is for independently programming both the target programmable logic device and the mirror programmable logic device based on control inputs received from a host processing system.

11. An apparatus according to claim 6, further comprising a clip-on adapter for removably mounting the apparatus to the target programmable logic device to connect the terminals of the target programmable logic device to the switches.

12. An apparatus according to claim 6, further comprising a replacement programmable logic device substantially identical to the target programmable logic device, the replacement programmable logic device for operating as a substitute for the target programmable logic device for purposes of said testing.

13. An apparatus according to claim 6, wherein when the target programmable logic device is mounted to a target board, the switches are configurable to allow programming of the logic design of the target programmable logic device from either the apparatus or from the target board.

14. An apparatus according to claim 6, further comprising a programmable pattern generator coupled to the controller for generating the stimulus.

15. An apparatus for allowing testing of a logic design of a target programmable logic device, the apparatus comprising:
   a mirror programmable logic device substantially identical to the target programmable logic device for emulating the target programmable logic device, the mirror programmable logic device and the target programmable logic device each having a plurality of input/output terminals;
   a programmable switch module including a plurality of individually configurable switches, each of the plurality of individually configurable switches for connection between an input or output input terminal of the mirror programmable logic device and a corresponding input or output terminal of the target programmable logic device; and
   a controller coupled to the switch module for selectively configuring the switches based on first control input to allow detection, at the output terminals of the mirror programmable logic device, of responses of the mirror programmable logic device to a stimulus applied concurrently to both the mirror programmable logic device and the target programmable logic device, while preventing the responses of the mirror programmable logic device from being received at output terminals of the target programmable logic device.

16. An apparatus according to claim 15, wherein the controller is further coupled to the mirror programmable logic device for programming the mirror programmable logic device with selected logic designs.

17. An apparatus according to claim 16, wherein the controller is further coupled to the target programmable logic device for programming the target programmable logic device with selected logic designs.

18. An apparatus according to claim 17, wherein the controller is for independently programming both the target programmable logic device and the mirror programmable logic device based on control inputs received from a host processing system.

19. An apparatus according to claim 15, wherein the apparatus further comprises an adapter for removably mounting the apparatus to the target programmable logic device to connect the terminals of the target programmable logic device to the switches.

20. An apparatus according to claim 15, further comprising a replacement programmable logic device substantially identical to the target programmable logic device, the replacement programmable logic device for operating as a substitute for the target programmable logic device during said testing.

21. An apparatus according to claim 15, further comprising a programmable pattern generator coupled to the controller for generating the stimulus.

22. An apparatus for allowing testing of a target programmable logic device programmable logic device, the apparatus comprising:

a mirror programmable logic device from substantially the same device family and of substantially the same device type as the target programmable logic device, the mirror programmable logic device and the target programmable logic device each having a plurality of input/output terminals;

a programmable switch module including a plurality of individually configurable switches, each of the plurality of individually configurable switches for connection between an input or output input terminal of the mirror programmable logic device and a corresponding input or output terminal of the target programmable logic device; and a controller coupled to the switch module for selectively configuring the switches based on first control input to couple input terminals of the mirror programmable logic device with the corresponding input terminals of the target programmable logic device and to decouple output terminals of the mirror programmable logic device from the corresponding output terminals of the target programmable logic device, such that a stimulus applied to an input terminal of the target programmable logic device is applied via the switching module to the corresponding input terminal of the mirror programmable logic device, and such that responses of the mirror programmable logic device to the stimulus are detectable at the output terminals of the mirror programmable logic device, wherein the controller is further coupled to the mirror programmable logic device for programming the mirror programmable logic device with selected logic designs based on second control input.

23. An apparatus according to claim 22, further comprising a clip-on adapter for removably mounting the apparatus to the target programmable logic device to connect the input/output terminals of the target programmable logic device to the switches.

24. An apparatus according to claim 22, further comprising a replacement programmable logic device substantially identical to the target programmable logic device, the replacement programmable logic device for operating in substitution for the target programmable logic device.

25. An apparatus according to claim 22, wherein the first and second control inputs are received from a host processing system, such that the logic designs of both the target programmable logic device and the mirror programmable logic device can be dynamically and independently configured from the host processing system.

26. An apparatus according to claim 22, wherein the target programmable logic device is mounted to a target board, and wherein the switches are configurable to allow programming of the logic design of the target programmable logic device from either the apparatus or from the target board.

27. An apparatus according to claim 22, further comprising a programmable pattern generator coupled to the controller for generating the stimulus.

28. A method of allowing testing of a logic design of a target programmable logic device, the method comprising:

operating a mirror programmable logic device substantially identical to the target programmable logic device, the mirror programmable logic device and the target programmable logic device each having a plurality of terminals; and selectively configuring a plurality of connections, each of the connections for selectively connecting a terminal of the mirror programmable logic device to a corresponding terminal of the target programmable logic device, said selectively configuring including configuring the plurality of connections to allow detection of an output of the mirror programmable logic device in response to a stimulus applied concurrently to inputs of both the mirror programmable logic device and the target programmable logic device while preventing outputs of the mirror programmable logic device from affecting the target programmable logic device.

29. A method according to claim 28, further comprising:

receiving control input from a host processing system; and automatically reconfiguring the set of connections in response to the control input.

30. A method according to claim 28, further comprising:

receiving first control input from a host processing system; and automatically programming a logic design of one of the target programmable logic device and the mirror programmable logic device in response to the first control input.

31. A method of testing a logic design of a programmable logic device, the method comprising:

configuring a set of connections between a first programmable logic device and a second programmable logic device to enable an input signal applied to an input terminal of one of the first programmable logic device and the second programmable logic device to also be applied concurrently to a corresponding input terminal of the other of the first programmable logic device and the second programmable logic device, while decoupling an output terminal of the first programmable logic device from the second programmable logic device;

applying the input signal concurrently to the corresponding input terminals of the first and second programmable logic devices; and outputting at a test terminal a signal from the output terminal of the first programmable logic device in response to the input signal.

32. A method according to claim 31, wherein the first programmable logic device is substantially identical to the second programmable logic device and is for emulating the second programmable logic device.

33. A method according to claim 31, further comprising:

receiving control input from a host processing system; and automatically reconfiguring the set of connections in response to the control input.

34. A method according to claim 31, further comprising:

receiving first control input from a host processing system; and automatically programming a logic design of the first programmable logic device in response to the first control input.

35. A method according to claim 31, further comprising:

receiving second control input from the host processing system; and automatically programming a logic design of the second programmable logic device in response to the second control input.

* * * * *